United States Patent [19]

Madre et al.

[11] Patent Number: 5,737,242

[45] Date of Patent: Apr. 7, 1998

[54] METHOD FOR AUTOMATICALLY DETERMINING PROBABILITIES ASSOCIATED WITH A BOOLEAN FUNCTION

[75] Inventors: Jean-Christophe Madre; Olivier Coudert, both of Boulogne Billancourt, France

[73] Assignee: Bull S.A., Puteaux, France

[21] Appl. No.: 742,872

[22] PCT Filed: Oct. 27, 1993

[86] PCT No.: PCT/FR93/01055

§ 371 Date: Aug. 29, 1994

§ 102(e) Date: Aug. 29, 1994

[87] PCT Pub. No.: WO94/10640

PCT Pub. Date: May 11, 1994

Related U.S. Application Data

[63] Continuation of Ser. No. 256,088, filed as PCT/FR93/01055, Oct. 27, 1993, published as WO94/10640, May 11, 1994, abandoned.

[30] Foreign Application Priority Data

Oct. 30, 1992 [FR] France .................. 92 13011

[51] Int. Cl.$^6$ .......................................... G06F 11/00
[52] U.S. Cl. ............. 364/554; 364/550; 364/551.01; 395/24; 395/51
[58] Field of Search ................. 364/554, 550, 364/551.01, 571.04, 488–491; 382/224, 141, 160; 371/26; 395/24, 27, 50–52, 61, 66, 77, 911, 912, 914, 55

[56] References Cited

U.S. PATENT DOCUMENTS

| | | | |
|---|---|---|---|
| 4,599,692 | 7/1986 | Tan et al. ..................... | 395/77 |
| 4,935,882 | 6/1990 | Pennebaker et al. ........... | 364/554 |
| 5,233,541 | 8/1993 | Corwin et al. ................ | 382/39 |
| 5,263,124 | 11/1993 | Weaver et al. ............... | 382/39 |
| 5,369,756 | 11/1994 | Imura et al. ................ | 395/914 |
| 5,434,794 | 7/1995 | Couder et al. ............... | 364/489 |
| 5,485,544 | 1/1996 | Nonaka et al. ............... | 395/50 |
| 5,587,930 | 12/1996 | Hori et al. .................. | 395/911 |

OTHER PUBLICATIONS

Randal E. Bryant, Graph–Based Algorithms, for Boolean Function Manipulation, Aug. 1986, IEEE Transaction on Computers, vol. C–35, No. 8, pp. 677–691.

Siegfried Weber, Conditioning of Events and Related Topics, IEEE International Conference Fuzzy Systems, Mar. 1992, pp. 881–888.

Soh et al., CAREL: Computer Aided Reliability Evaluator for Distributed Computing Networks, IEEE Transaction Parallel and Distributed Systems, vol. 2, No. 2, Apr. 1991, pp. 199–213.

Reliability Engineering & System Safety, Elsevier Applied Science Ltd, vol. 1993, England, pp. 203–211, Antoine Rauzy, "New Algorithms for Fault Trees Analysis".

Proceedings of the Annual Symposium on Reliability and Maintainability, IEEE Press New York, Jan. 21, 1992, Las Vegas, Nev., pp. 370–375, W.G. Schneeweiss, "Approximate Fault–Tree Analysis Without Cut Sets".

IEEE Transactions on Reliability, IEEE Press, vol. 41, No. 3, Sep. 1992, NY, US, pp. 343–351, W.G. Scneeweiss, "Reliability Theory for Large Linear Systems . . . ".

IBM Technical Disclosure Bulletin, vol. 14, No. 11, Apr. 1972, pp. 3521–3522, K. Koch, "Representation of Tree Data Structures for Data Manipulation . . . ".

Primary Examiner—Emanuel T. Voeltz
Assistant Examiner—Hal D. Wachsman
Attorney, Agent, or Firm—Kerkam, Stowell, Kondracki & Clark, P.C.; Edward J. Kondracki

[57] ABSTRACT

The invention relates to a method that makes it possible to automatically and exactly calculate the probabilities associated with a Boolean function. The probability of an event represented by a Boolean function (f) is determined by constituting a binary decision diagram of the function and by making recursive traversals through the diagram.

17 Claims, 2 Drawing Sheets

| Ad n | VAR | IND$_L$ | IND$_H$ | GEST | PROBA |
|------|-----|---------|---------|------|-------|
| Ad$_1$ | $x_1$ | "Ad$_2$" | "Ad$_3$" | | P($x_1$) |
| Ad$_2$ | $x_2$ | "Val$_1$" | "Ad$_4$" | | P($x_2$) |
| Ad$_3$ | $x_2$ | "Val$_0$" | "Val$_1$" | | |
| Ad$_4$ | $x_3$ | "Val$_0$" | "Val$_1$" | | P($x_3$) |

METHOD FOR AUTOMATICALLY DETERMINING PROBABILITIES ASSOCIATED WITH A BOOLEAN FUNCTION

This is a Continuation of application Ser. No. 08/256,088, filed as PCT/FR93/01055 Oct. 27, 1993, published as WO94/10640 May 11, 1994, now abandoned.

FIELD OF THE INVENTION

The invention relates to a method for automatically determining the probabilities associated with a Boolean function, with the aid of a data processing machine.

BACKGROUND OF THE INVENTION

Boolean functions are manipulated in many fields. By way of example, synthesis and optimization of electronic circuits and system fault analysis can employ the manipulation of Boolean functions.

In fault analysis, for example, the occurrence of a fault as a function of external events capable of causing this fault can be analyzed with the aid of a Boolean function.

More generally, in any system, the occurrence of a reference event or of an action, when it is a function of one or more concomitant events, also called microscopic events, can thus be analyzed. Each microscopic event is accordingly a variable of the function.

For comprehension of the ensuing description, it is appropriate to recall some concepts and definitions relating to Boolean functions, and the terminology used.

Let us assume a Boolean function f is defined by the following formula: $f = x_1 x_2^* + x_1^* x_2 x_3$. This is said to be a propositional formula, and $x_1$, $x_2$, $x_3$ are propositional variables, corresponding to atomic events capable of causing the appearance of the reference event symbolized by the letter f and represented by the formula.

Hence in the analysis of system faults the atomic events are the fault causes, and the reference event is a particular fault associated with these causes combined with one another in certain ways.

The terms "$x_1$", "$x_2$" "$x_3$" and "$x_1^*$" "$x_2^*$" "$x_3^*$", which appear in the formula, are literals corresponding to the propositional variables $x_1$, $x_2$, $x_3$. A literal shows how the propositional variable is involved in the function, or in other words whether the occurrence or nonoccurrence of the associated event is decisive or unimportant. $x_1 x_2^*$ and $x_1^* x_2 x_3$ are products of literals. A product is accordingly a conjunction of variables and negations of variables.

The first product, $x_1 x2^*$, means that the presence or absence of the third variable $x_3$ is unimportant.

The formula means that the reference event occurs (f=1) when simultaneously the first atomic event $x_1$ occurs ($x_1=1$) and the second event $x_2$ does not occur ($x_2=0$), or when simultaneously the first event $x_1$ does not occur and the second and third events $x_2$ and $x_3$ do occur.

Such a formula is in fact the result of either simulation or analysis done with a prototype.

In analysis of a system (in terms of function or for faults), such a formula is conventionally shown in the form of a table that shows the various products of the function. The table associated with the function given in this example would accordingly contain the products $x_1 x_2^*$ and $x_1^* x_2 x_3$.

In the field of system fault analysis, a table of this kind is called a fault tree. More generally, it may be called an event tree.

Such a tree may be used to perform various analyses or calculations relating to the behavior of the system. In particular, one may contemplate calculating the probability of occurrence of a reference event as a function of that of each of the atomic events.

To that end, the table shows not only the products contributing to the occurrence of the function but also the probability of occurrence of each atomic event. This probability has been determined, for instance during simulation or analysis.

Nevertheless, calculating the probability of each reference event, such as a fault, must be done after that analysis or simulation. This calculation needs to be automated, because either the table includes an extremely large number of products, or a large number of reference events must be analyzed.

Methods known thus far do not provide satisfaction. In fact, they begin with approximation formulas that require calculation of the implicants of the function.

It will be recalled that an implicant of a function is a product that implies that function. It will also be recalled that a first product P "contains" a second product P', if the relation P implies P' (this is written P→P') is true, and finally, a prime implicant is an implicant such that there is no other implicant that contains it.

The use of approximation formulas does not make it possible to attain an exact result. Moreover, this approximate calculation requires processing equipment with a large computational and memorization capacity, because these implicants must be calculated and stored in memory, and numerous intermediate results, originating from these approximative calculations with the implicants, must also be calculated and stored, so that later these implicants or these intermediate results can be combined to obtain the final result.

SUMMARY OF THE INVENTION

The objects of the invention are accordingly to obtain a method that makes it possible to automatically obtain the exact probability of a reference event, without requiring large memorization capacity.

According to the invention, a method for automatically, with the aid of a data processing machine, determining the probability of a reference event depending on atomic events combined with one another, each atomic event having a probability of occurrence known in advance, is characterized in that it consists of working out the binary decision diagram corresponding to the function representative of the reference event, and recursively traversing this diagram to obtain the probability P(f) of the reference event by applying the formula $P(f) = (1 - P(x_1)) \cdot P(L) + P(x_1) \cdot P(H)$, in which $P(x_1)$ is the probability, known in advance, of the root event of the diagrams, and P(L) and P(H), respectively, are the probabilities of the negative branch and positive branch of the tree, these latter being obtained in the course of recursive traversals of the binary decision diagram.

In a known manner, a binary decision diagram or graph is made up of a certain number of labels, connected to one another by branches. Each label represents a predetermined variable of the function, from which two branches begin. The set constituted by a label, or in other words a variable, and the two branches that begin at it constitute a node, sometimes called a vertex. Each branch may be either a terminal branch, which ends at a terminal leaf having the value "0" or "1" or an intermediate branch, which ends at the label of a different node. One of the branches that begins at a label is called the low or negative branch and represents what happens when the value of the associated variable is "0" (by using the conventions recalled above), while the other branch, called the high or positive branch, shows what happens when the variable is "1". In fact, the tree begins at a unique root variable (or label) called the root, from which two branches begin to which other nodes or leaves are connected in cascade.

In traversing the tree from the root to the terminal leaf of value 1, a combination of literals is determined for which the function has the value 1, that is, a combination (product) of variables causing the appearance of the reference event shown is reconstituted. Consequently, by making each of the traversals from the root to each of the terminal leaves of value 1, one determines each of the combinations of variables that cause the appearance of the reference event.

Such a diagram or graph accordingly makes it possible to visualize all the combinations of variables of one function, in an extremely complete and concise way. The memory space occupied is less by comparison with the tables, and the processing time for the functions shown in the form of binary decision graphs are much faster.

Various approaches to binary decision diagrams have been contemplated. Randal E. Bryant, for instance, in a publication appearing in IEEE Transactions on Computers, Vol. C-35, No. 8, August 1986, has shown how the variables and accordingly the nodes can be ordered so as to arrive at extremely compact graphs that nevertheless are perfectly representative of the various combinations of variables appearing in one function.

In FIG. 1, a binary decision diagram of a Boolean function is shown, in which three propositional variables $x_1$, $x_2$, $x_3$ appear.

In the example shown in this FIG. 1, a first variable, identified by a label $x_1$, is the root of the graph. Two branches begin at this variable, a first branch at the bottom left and a second branch at the bottom right. The left-hand branch is called the low branch, while the right-hand branch is called the high branch. The set of the root, the low branch and the high branch accordingly constitutes a first node of the diagram.

The low branch and the high branch each end in a second variable identified by a label $x_2$. A low branch and a high branch are also associated with this second variable, and this constitutes another node.

The set of labels (or variables), branches, and leaves associated with a low branch of another variable constitutes what will hereinafter be called the low part L of this variable. The set associated with the high branch of a variable constitutes the high part, marked H, of this variable.

Thus the high part of the variable $x_1$ begins at a node whose root is the variable $x_2$, whose low part is a leaf of value 0, and whose high part is a leaf of value 1.

In traversing the branches of the tree beginning with the root in the direction of the leaves of value "1", one determines that the function shown has the value 1 when:

$x_2$ has the value 0 and simultaneously $x_1$ has the value 0, or $x_1$ has the value 0 and simultaneously $x_2$ has the value 1 while $x_3$ has the value 1.

The above is deduced from the traversal of the low branches associated with the root $x_1$.

In addition, from the high part associated with the root $x_1$, one deduces that the function also has the value 1 when $x_1$ and $x_2$ simultaneously have the value 1.

As a consequence of the above, the function shown may be written as $f=x_1{}^*x_2{}^*+x_1{}^*x_2x_3+x_1x_2$.

The construction of a binary decision diagram, as shown in FIG. 1, is done in accordance with predetermined known rules, which are not the subject of the present invention. They are described in the aforementioned publication by Randal E. Bryant.

Accordingly, the invention extremely advantageously exploits the fact that each high (positive) or low (negative) branch of the diagram in itself constitutes a subdiagram which in turn has its own high and low branches.

In short, the determination of the probability of each branch requires simply the memorization of the probability of each sub-branch associated directly with that branch. Hence in the course of the recursive traversals, it suffices to memorize only two values to determine the probability of each sub-branch, and hence a maximum of four values for the entire diagram.

BRIEF DESCRIPTION OF THE DRAWINGS

Further characteristics and advantages of the invention will become apparent from the ensuing description in conjunction with FIGS. 1 and 2, in which.

DETAILED DESCRIPTION OF THE PREFERRED EMBODIMENTS

Figures 1, 2:
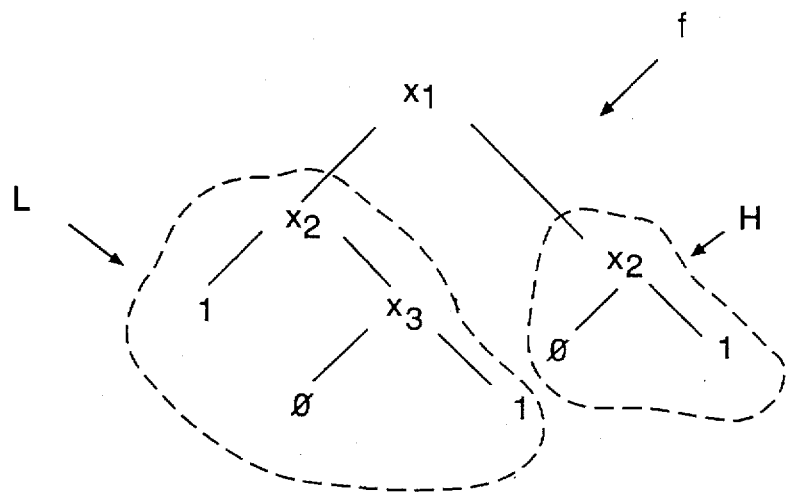
FIG. 1 schematically shows the binary decision diagram of a Boolean function (f)
FIG. 2 shows how the memory of a processing apparatus may be organized so as to contain the information representing the diagram of FIG. 1.
Figure 3:
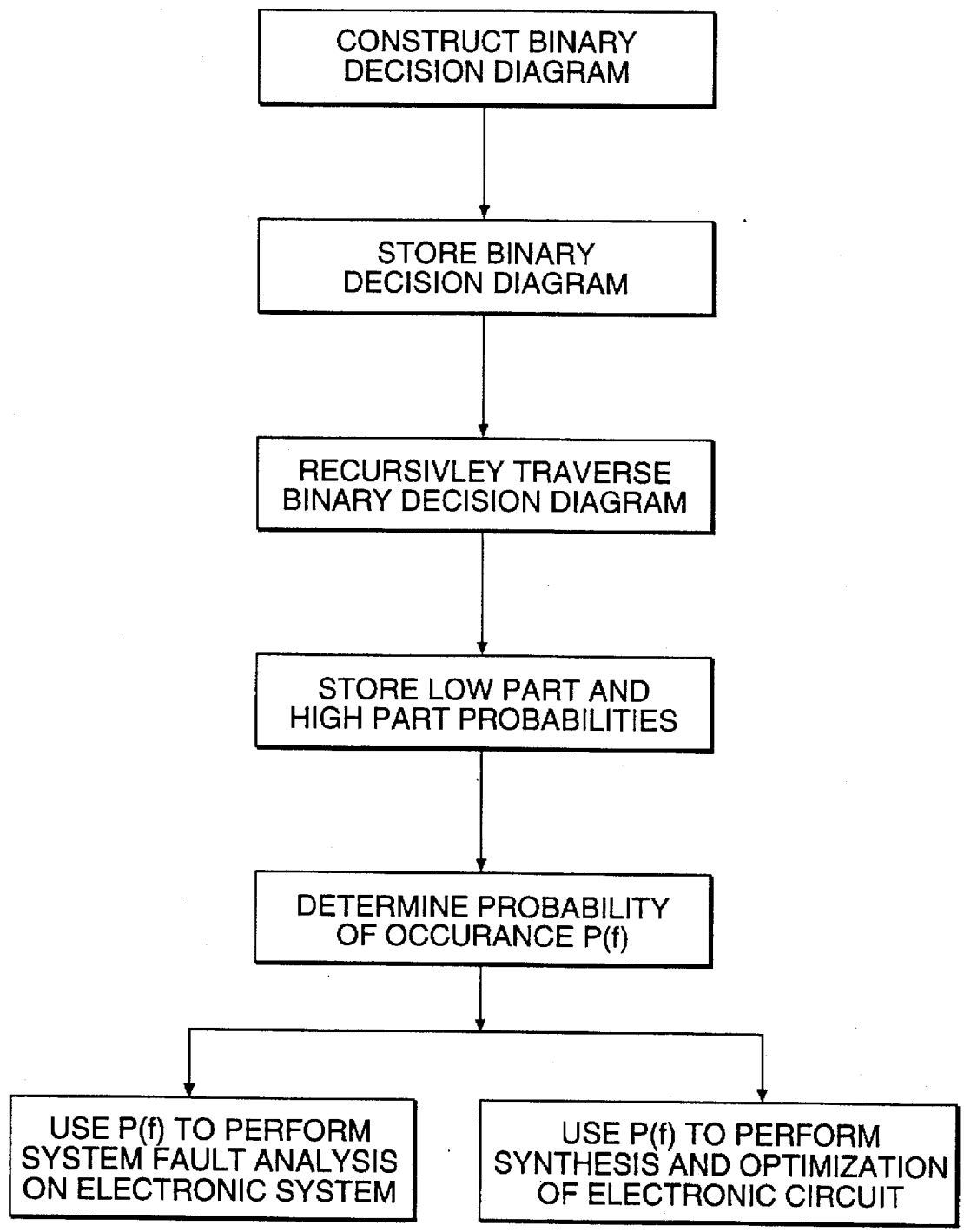
FIG. 3 is a flow chart which generally shows the steps used in the method of the instant invention.

FIG. 1, and the way to use it, have already been described extensively above.

In a known manner and as indicated, the diagram of FIG. 1 is obtained from a table or event tree, not shown in the drawings. The determination of the diagram from this table, which is not the subject of the present invention, is done in such a way as to optimize the size of the diagram so that the number of labels and branches will be reduced as much as possible.

In short, it is stated that the function f illustrated by this diagram and whose developed formula is $f=x_1{}^*x_2{}^*+x_1{}^*x_2x_3+x_1x_2$ can also be written, by previously agreed upon conventions, as $f=x_1{}^*L+x_1H$.

The invention begins with this statement and advantageously exploits the fact that the mode of exact calculation of the probability associated with such a function is as follows: $P(f)=(P(x_1{}^*))\cdot P(L)+P(x_1{}^*)\cdot P(H)$, in which P(a) is the probability associated with an event a, which can finally be written as $P(F)=(1-P(x_1))\cdot P(L))+P(x_1)\cdot P(H)$.

L and H are subdiagrams in which the variables $x_2$ and/or $x_3$ appear. Hence the prior knowledge of the probabilities $P(x_1)$, $P(x_2)$, $P(x_3)$ associated with each microscopic event makes it possible, by making recursive traversals in the diagram, to obtain the global probability of the reference event.

FIG. 2 shows how the memory of a computer may be organized to contain the information making up the binary decision diagram of the function shown in FIG. 1. This is absolutely not limiting.

It is from this information in memory that the processing system is capable of calculating the probability of the function.

In a known fashion, the memory is organized in words, and each word is determined by its absolute or relative address and.

In order to represent a binary decision diagram, each word may be divided, for example, into at least five fields: a first field VAR, a second field $IND_L$, a third field $IND_H$, a fourth field GEST, and finally a fifth field PROBA.

The first field VAR of a word would contain information indicating the nature and rank of a propositional variable of the function, for example $x_n$.

The second field $IND_L$ would indicate whether the low branch of the corresponding variable ends in a node or a leaf.

The third field $IND_H$ would indicate whether the high part of the corresponding variable ends in a leaf or in a node.

The fourth field GEST would for example contain management parameters required for using the memory, when the traversals are done between the various addresses.

More precisely, the second and third fields could be supplemented as follows: If the low branch associated with the propositional variable contained in the word ends in a leaf, then this second field would contain an indication "Val 0" or "Val 1" of the value of this leaf, as shown in certain cases in this FIG. 2.

Conversely, if the low branch associated with a propositional variable ends in a node, then this second field $IND_L$ would contain the value of the memory address of the word in which this node is written.

The third field $IND_H$ would indicate, in the same way as the second field, whether the high branch associated with a variable ends in a node or a lead, and as applicable contains either an address or a value.

The fourth field GEST would contain management parameters indicating the traversals that have already been made, or any other type of information required for the management and utilization of this memory.

Finally, the fifth field PROBA would contain the value known in advance of the probability associated with the corresponding variable $x_n$, indicated in the first field VAR.

Hence by beginning with the word located at the address $AD_1$ and traversing the entire memory, the processing system can reconstitute the products for which the function has the value "1". It is then capable of reconstituting the decision diagram and its different nodes.

The determination of the probabilities associated with each branch or sub-branch leads the system to break down the existing nodes in the binary decision diagram.

By convention, in the ensuing description, a formula of the type Nd(x, L, H)=y, breaks down the node y into its root, that is, the variable x, its left-hand or low branch L, and its right-hand or high branch H.

The determination of the value of the probability of an event, whose function f is represented by a binary decision diagram, can be obtained by implementing a specific algorithm that will hereinafter be called "GETPROBA (f)", which employs the following steps:

First, a test is done to determine the nature of the function.

If f=0, then GETPROBA(f)=0, and if f=1, then GETPROBA(f)=1;

if f is other than 0 or 1, which means that f is present in the form of a node having a root $x_k$, a low branch L and a high branch H, then a decomposition of the node is performed, and then the "GETPROBA" function implements the following instruction:

GETPROBA=(1-GETELEMENTARYPROBA($x_k$))
·GETPROBA(L)+GETELEMENTARYPROBA($x_k$)
·GETPROBA(H),

In which "GETELEMENTARYPROBA($x_k$)" is an instruction whose execution consists of reading the value of the probability associated with the variable ($x_k$), in the fifth field "PROBA", and incorporating it into the calculation.

It can also be stated that the instruction "GETPROBA" is recursive, since it requires the calculation of the probabilities associated with the low and high branches L and H, by having recourse to itself. As a consequence, the calculation always begins at terminal nodes of the tree, or in other words nodes whose low and high branches end in terminal leaves having the value 0 and 1, or vice versa.

It can also be stated that contrary to the prior art, the algorithm employed makes it possible to determine exactly the value of the probability associated with a predetermined event, since no simplification or approximation whatever is required during the calculation.

In addition, the memory consumption is minimal. It suffices in the memory of the processing equipment to provide a buffer memory, whose contents are modified upon each recursion, and which at the time the probability associated with a label is calculated contains the probability, obtained by implementing the "GETPROBA" function, of each high and low branch associated with this label.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

We claim:

1. A method for fault analysis in an electronic system, said method determining a probability (P(f)) of occurrence of a reference event in the system, said reference event corresponding to a Boolean function (f) of atomic events ($x_1$, $x_2$, $x_3$, ... $x_k$ ...) each having a predetermined probability of occurrence (P($x_1$),P($x_2$),P($x_3$), ... ,P($x_k$) ... ), said method comprising:

constructing a binary decision diagram from said Boolean function, said binary decision diagram having a root event ($x_1$) made of one of said atomic events having the predetermined probability of occurrence P($x_1$), said root event being connected to a low part (L) and a high part (H) of said binary decision diagram each including others of said atomic events;

storing, in memory means of a data processing machine, data representative of said binary decision diagram and respective predetermined probabilities of said atomic events;

recursively traversing the binary decision diagram from the stored data and predetermined probabilities of the atomic events in each of said low and high parts of said binary decision diagram to obtain a low part probability (P(L)) and a high part probability (P(H));

storing said low part probability and said high part probability in said memory means;

determining, from said stored predetermined probabilities of said root event, said low part probability and said high part probability, the probability of occurrence P(f) of the reference event by applying the formula:

P(f)=(1–P($x_1$))·P(L)+P($x_1$)·P(H), and using said probability of occurrence P(f) to perform fault analysis on said electronic system.

2. The method of claim 1, wherein said memory means is organized in words, each word having an address (ADn), and being divided into a predetermined number of fields to be representative of said binary decision diagram.

3. The method of claim 2, wherein said binary decision diagram includes nodes, each of said nodes representing one of said atomic events, said atomic events having respective natures and ranks in the binary decision diagram, and said predetermined number of fields includes a first field (VAR) representative of said nature and rank of a corresponding one of said atomic events.

4. The method of claim 2, wherein said binary decision diagram comprises nodes and leafs, each node representing one of said atomic events and having a low branch and a high branch, while each leaf is an end of a branch and has a binary value, and said predetermined number of fields includes a second field ($IND_L$) indicating whether said low branch of a corresponding node ends in a node or a leaf.

5. The method of claim 4, wherein said low branch ends in a leaf having said binary value and said second field is representative of said binary value.

6. The method of claim 4, wherein said low branch ends in a node and said second field is representative of said address of said word in said memory means.

7. The method of claim 2, wherein said binary decision diagram comprises nodes and leafs, each node representing one of said atomic events and having a low branch and a high branch while each leaf is an end of a branch and has a binary value, and said predetermined number of fields includes a high branch field ($IND_H$) indicating whether said high branch of a corresponding node ends in a node or a leaf.

8. The method of claim 7, wherein said high branch ends in a leaf having said binary value and said second field is representative of said binary value.

9. The method of claim 7, wherein said high branch ends in a node and said high branch field is representative of said address of said word in said memory means.

10. The method of claim 2, wherein said predetermined number of fields includes a management field (GEST) containing parameters for managing said memory means when said traversals are done between said addresses.

11. The method of claim 2, wherein said predetermined number of fields includes a probability field (PROBA) representative of said predetermined probability of occurrence of a corresponding one of said atomic events.

12. The method of claim 1, wherein:

said binary decision diagram comprises nodes and leafs, each node representing one ($x_k$) of said atomic events and having a low branch (L) and a high branch (H) while each leaf is an end of a branch and has a binary value, said recursive traversing step comprises implementing a first function (GETPROBA), which includes a test phase for determining whether the reference event (f) is one of said leaves or said nodes, and said recursive traversing step is performed from the terminal nodes of said binary decision diagram.

13. The method of claim 12, wherein the reference event (f) determined during said test phase is a leaf having said binary value and said first function (GETPROBA(f)) has said binary value.

14. The method of claim 12, wherein the reference event (f) determined during said test phase is a node and said step of implementing a first function (GETPROBA) comprises determining said atomic event ($x_k$), said low branch and said high branch of said node, applying a second function (GETELEMENTARYPROBA($x_k$)) for retrieving said predetermined probability of occurrence (P($X_k$)) of said atomic event, and determining said first function from the formula:

GETPROBA=(1−GETELEMENTARYPROBA($x_k$))
·GETPROBA(L)+GETELEMENTARYPROBA($x_k$)
GETPROBA(H).

15. The method of claim 14, wherein said second function (GETELEMENTARYPROBA($x_k$)) is an instruction for reading said predetermined probability of occurrence (P($x_k$)) from a probability field (PROBA) of a corresponding word in said memory means.

16. The method of claim 14, wherein said memory means has buffer memory means containing said probability (GETPROBA) obtained from said formula and said buffer memory means is modified upon each of said recursion.

17. A method for synthesis and optimization of electronic circuits, said method determining a probability (P(f)) of occurrence of a reference event in the electronic circuits, said reference event corresponding to a Boolean function (f) of atomic events ($x_1, x_2, x_3, \ldots x_k \ldots$) each having a predetermined probability of occurrence (P($x_1$),P($x_2$),P($x_3$),....,P($x_k$) ...), said method comprising:

constructing a binary decision diagram from said Boolean function, said binary decision diagram having a root event ($x_1$) made of one of said atomic events having the predetermined probability of occurrence P($x_1$), said root event being connected to a low part (L) and a high part (H) of said binary decision diagram each including others of said atomic events;

storing, in memory means of a data processing machine, data representative of said binary decision diagram and respective predetermined probabilities of said atomic events;

recursively traversing the binary decision diagram from the stored data and predetermined probabilities of the atomic events in each of said low and high parts of said binary decision diagram to obtain a low part probability (P(L)) and a high part probability (P(H));

storing said low part probability and said high part probability in said memory means;

determining, from said stored predetermined probabilities of said root event, said low part probability and said high part probability, the probability of occurrence P(f) of the reference event by applying the formula: P(f)= (1−P($x_1$))·P(L)+P($x_1$)·P(H), and using said probability of occurrence P(f) to perform synthesis and optimization of said electronic circuits.

* * * * *